United States Patent
Saito

(10) Patent No.: US 7,664,307 B2
(45) Date of Patent: Feb. 16, 2010

(54) PHOTOMASK MANUFACTURING SUPPORT SYSTEM

(75) Inventor: Yasuko Saito, Tokyo (JP)

(73) Assignee: NEC Corporation, Tokyo (JP)

( * ) Notice: Subject to any disclaimer, the term of this patent is extended or adjusted under 35 U.S.C. 154(b) by 657 days.

(21) Appl. No.: 11/092,708

(22) Filed: Mar. 30, 2005

(65) Prior Publication Data

US 2005/0223349 A1    Oct. 6, 2005

(30) Foreign Application Priority Data

Mar. 30, 2004    (JP)    ............... 2004-097857

(51) Int. Cl.
*G06K 9/00*    (2006.01)
(52) U.S. Cl. ................................. 382/144
(58) Field of Classification Search ............... 382/100, 382/141, 144, 145, 149, 151; 716/19, 21, 716/22; 378/34–35; 430/5; 348/125–126; 438/16–20
See application file for complete search history.

(56) References Cited

U.S. PATENT DOCUMENTS 5,046,109 A * 9/1991 Fujimori et al. ............. 382/144
6,272,236 B1 * 8/2001 Pierrat et al. ................ 382/144
6,461,882 B2 * 10/2002 Ishida et al. ................... 438/17
2004/0148584 A1 * 7/2004 Tokunaga et al. ............. 716/21

FOREIGN PATENT DOCUMENTS

JP    9-288687    11/1997
JP    09-288687   11/1997

* cited by examiner

*Primary Examiner*—Samir A. Ahmed
*Assistant Examiner*—Atiba O. Fitzpatrick
(74) *Attorney, Agent, or Firm*—Young & Thompson

(57) ABSTRACT

A drawing data inputting/interpreting section of a data processing device reads in hierarchical structured drawing data from a first memory device and stores interpreted drawing data information extracted as graphic information in a second memory device. A data analysis section reads in the interpreted drawing data information, analyzes information necessary for a drawing step, and stores the same as drawing analysis results in the second memory device. In addition, a data conversion section reads in the interpreted drawing data information, and after a format conversion to inspection data, stores the converted inspection data in the second memory device. Thereby, a drawing data analysis step and an inspecting data conversion step can be carried out in parallel.

2 Claims, 4 Drawing Sheets

PHOTOMASK MANUFACTURING SUPPORT SYSTEM

BACKGROUND OF THE INVENTION

1. Field of the Invention

The present invention relates to a photomask manufacturing support system for carrying out a drawing data analysis and an inspecting data conversion of a semiconductor photomask and/or reticle.

2. Description of the Related Art

For manufacturing photomasks and reticles (hereinafter, generally referred to as "photomasks") of semiconductor devices with a high yield, a pre-analysis of drawing data for photomasks and an observation and analysis of patterns on photomasks have become important. Results of these analyses are utilized as parameters to optimize finished drawing conditions of photomasks. When these analyses are not carried out, drawing device operation parameters are to be set empirically or by guesswork, which may considerably deteriorate the drawing yield.

However, recently, in semiconductor photomask manufacturing process, design data has been miniaturized as a result of miniaturization of semiconductor rules, and in accordance therewith, the data volume has become huge. Thereby, an influence of data processing time exerted on throughput has been increased. Therefore, the time required for a pre-analysis of drawing data and an observation and analysis of a photomask pattern has been extended long, this has exceeded a drawing time in some cases, which has caused an increase in operation costs.

In regard thereto, a technique for dividing a structure formed by breaking a hierarchical structure of photomask drawing data into a plurality of regions and carrying out hierarchical processing of pattern data contained in each region in a parallel distributed processing has been disclosed in Japanese Patent Application Laid-Open No. H9-288687, for example. In Japanese Patent Application Laid-Open No. H9-288687, it has been described that the time for hierarchical processing can be thereby shortened. However, by the method described in Japanese Patent Application Laid-Open No. H9-288687, although the generation time of photomask drawing data or photomask inspection data can be shortened, this does not lead to a generation of data to be feed back to the above-mentioned drawing device operation parameters, therefore, operation costs for the entire drawing step cannot be reduced.

FIG. 1 is a flowchart showing an outline of photomask manufacturing process in a conventional system. First, as shown in step S1 of FIG. 1, photomask drawing data 31 for a photomask is charged into manufacturing (trial manufacturing). This photomask drawing data 31 is supplied for a drawing analysis step shown in step S21 and an inspecting data conversion step shown in step S22, respectively.

Results of a drawing analysis obtained in the drawing analysis step of step S21 are feed back to a drawing step shown in step S3, which is a following step, then photomask drawing is carried out. After drawing, as shown in step S4, post-steps such as processings and an inspection and measurement of the drawn photomask are carried out.

In addition, in the inspecting data conversion step shown in step S22, which is a completely different step from the drawing analysis step shown in step S21, DB inspection data 43 for an inspection apparatus is obtained. Thereafter, as shown in step S5, a DB (Die-to-Database) inspection is applied to the photomask pattern by use of the inspection data 43. The DB inspection means a defect inspection carried out by comparing the photomask pattern with the inspection data 43.

Next, as shown in step S6, a delivery judgement is carried out based on inspection results of step S5. As such, the drawing data 31 charged into manufacturing is separately supplied for the drawing analysis step (step S21) and inspecting data conversion (step S22), and the respective steps uniquely carry out processings.

However, the above-described conventional technique has the following problems. In the conventional photomask manufacturing method shown in FIG. 1, since the drawing analysis step and the inspecting data conversion step independently exist, it is necessary to separately control the respective steps. Accordingly, if a single operator controls both steps, an operation time obtained by adding operation times of both steps is required, while if both steps are carried out in parallel, two operators are required. In either case, operation costs are increased. In addition, generally, drawing data formats have no compatibility between different drawing apparatuses, steps according to respective drawing data formats are required, therein a problem exists.

In addition, since the same drawing data is separately analyzed in two steps, an excessive time is required for the analysis itself. In the inspecting data conversion step, from the nature of comparing an observed photomask image with inspection data, it is necessary to interpret drawing data to convert formats to data closer to the observed photomask image. On the other hand, in the drawing data analysis step, as well, since it is necessary to obtain an image after drawing, that is, an observed photomask image, it is necessary to interpret drawing data to obtain data close to the observed image. In the conventional photomask manufacturing method, since these similar processings are separately executed completely independently, the operation time occurs doubly. In addition, since the types of drawing data are dependent on drawing apparatuses, a large number of drawing data formats are generated. And, as the number of drawing data formats increases, the types of operations are increased in respective steps.

SUMMARY OF THE INVENTION

It is an object of the present invention to provide a photomask manufacturing support system capable of improving throughput by reducing operation costs for process without lowering the yield.

A photomask manufacturing support system according to the present invention comprises: a drawing data interpreting unit for extracting graphic information for respective mask patterns from drawing data which has a hierarchical structure consisting of a plurality of layer's information; a data analysis unit for analyzing the graphic information to output analysis results thereof to be used in a mask pattern drawing process; and a data conversion unit for converting the graphic information to inspection data for carrying out a defect inspection in comparison with a mask pattern to be inspected.

According to the present invention, by integrating a drawing data analysis and an inspecting data conversion, operations can be reduced by an integration of operations, which have conventionally occurred separately, and data conversion can be approximately simultaneously executed in parallel with data analysis. Thereby, the number of man-hours can be cut down. Accordingly, without lowering the yield, operation costs for photomask manufacturing processes are reduced, thus the throughput can be improved. In addition, the drawing data interpreting unit can be used in both steps of a drawing data analysis step and an inspecting data conversion step, thus efficiency of the drawing data analysis can be improved.

DETAILED DESCRIPTION OF THE PREFERRED EMBODIMENTS

Figure 1:
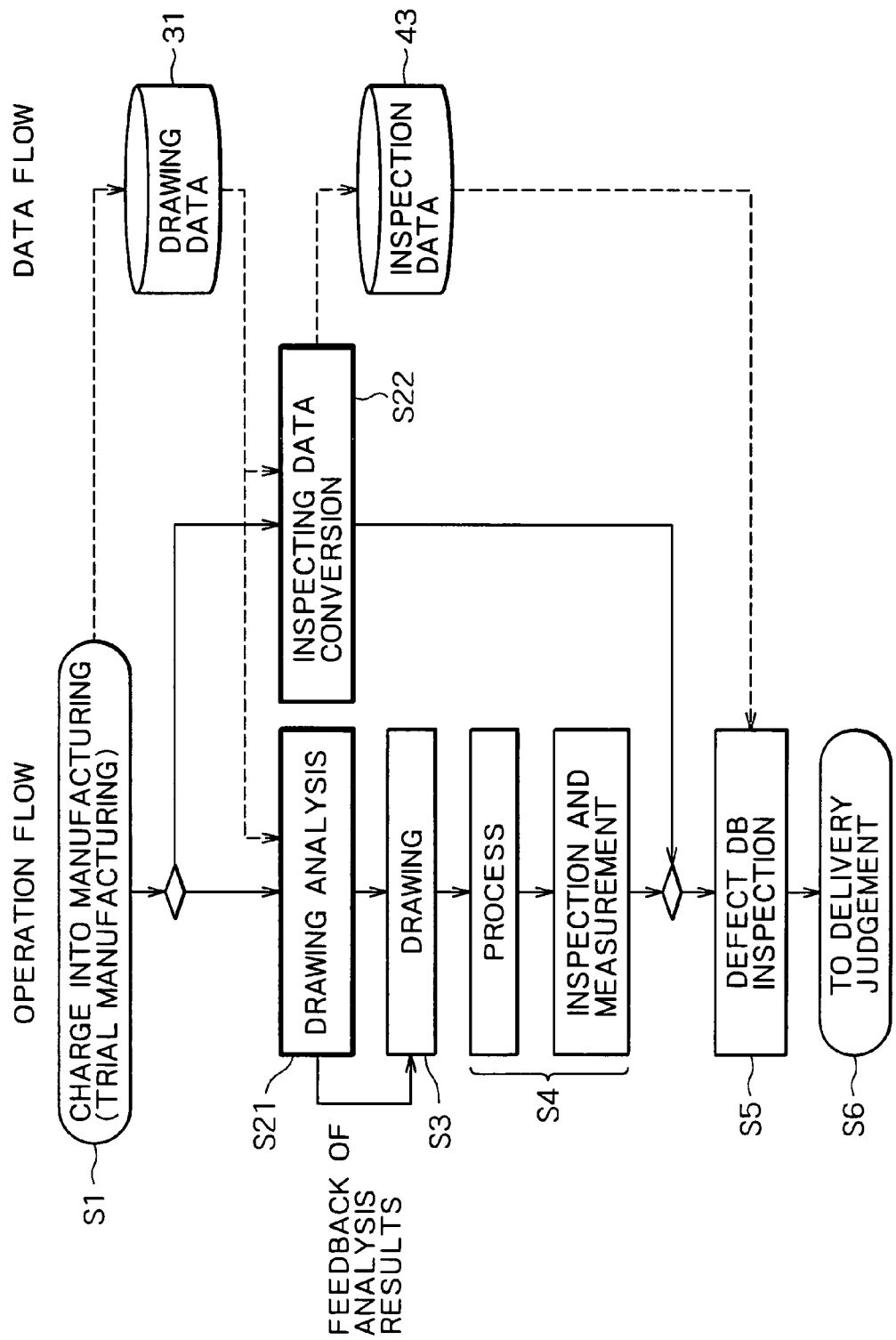
FIG. 1 is a flowchart showing an outline of conventional photomask manufacturing process.
Figure 2:
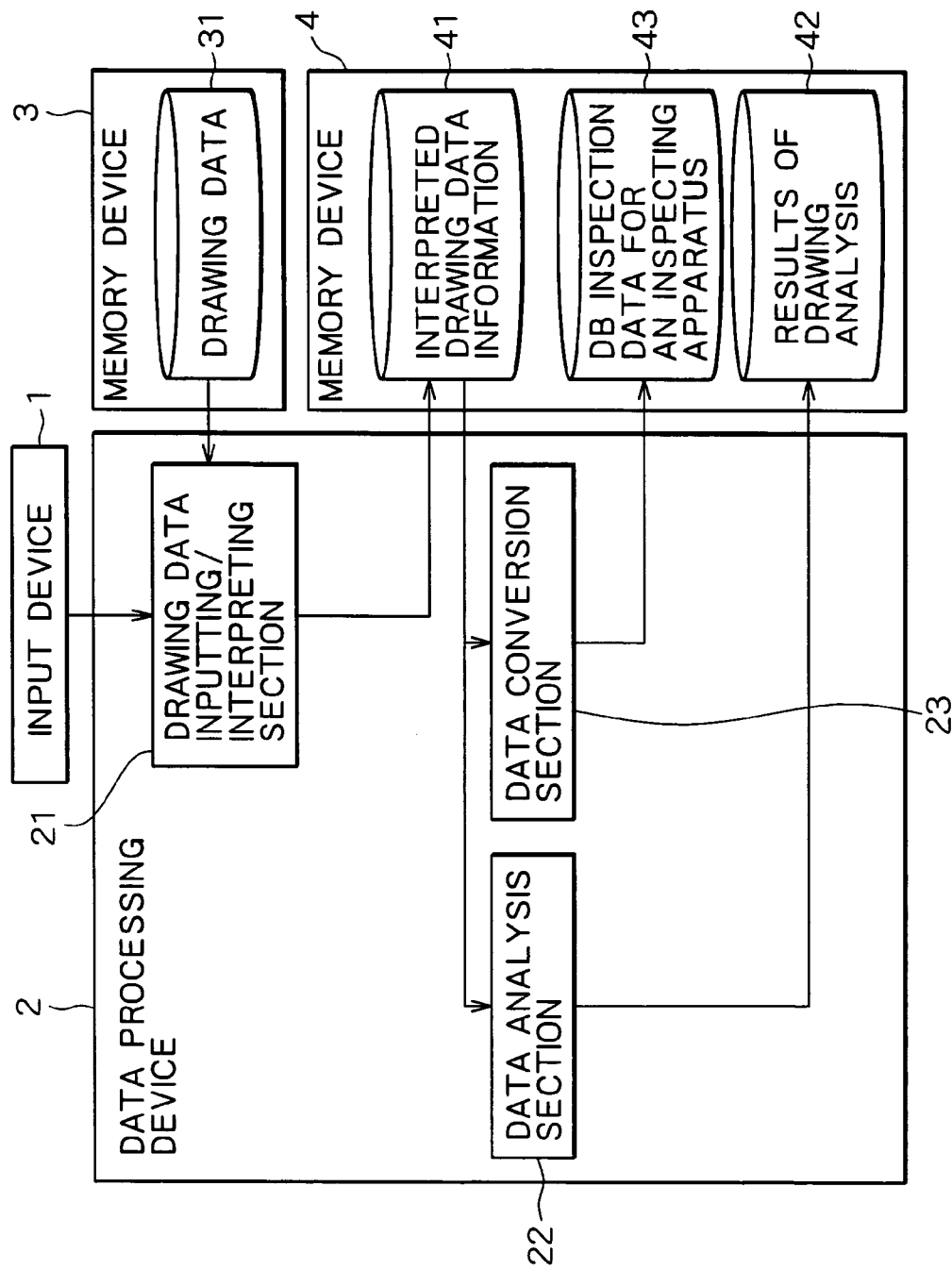
FIG. 2 is a block diagram showing a photomask manufacturing support system according to a first embodiment of the present invention.

Hereinafter, embodiments of the present invention will be described in detail with reference to the attached drawings. First, a first embodiment of the present invention will be described. FIG. 2 is a block diagram showing a photomask manufacturing support system according to the present embodiment. As shown in FIG. 2, in the photomask manufacturing support system according to the present embodiment, an input device 1 such as a keyboard or a mouse, a data processing device 2 to be operated by program control, and memory devices 3 and 4 for storing information are provided.

In the data processing device 2, a drawing data inputting/interpreting section 21, a drawing data analysis section 22, and an inspecting data conversion section 23 are provided. In the memory device 3, drawing data 31 is stored, and in the memory device 4, interpreted drawing data information 41, drawing analysis results 42, and DB inspection data 43 for an inspection apparatus are stored. The drawing data 31 of the memory device 3 and a processing parameter inputted by the input device 1 are to be inputted into the drawing data inputting/interpreting section 21, the drawing data 31 is to be interpreted in the drawing data inputting/interpreting section 21, and this is to be stored as a interpreted drawing data information 41 in the memory device 4. In addition, the data analysis section 22 and data conversion section 23 are, respectively, for reading in the interpreted drawing data information 41 and carrying out an analysis or conversion. Analysis results in the data analysis section 22 are to be stored as drawing analysis results 42 in the memory device 4. In addition, conversion results in the data conversion section 23 are to be stored as DB inspection data 43 for an inspection apparatus in the memory device 4.

Figure 3:
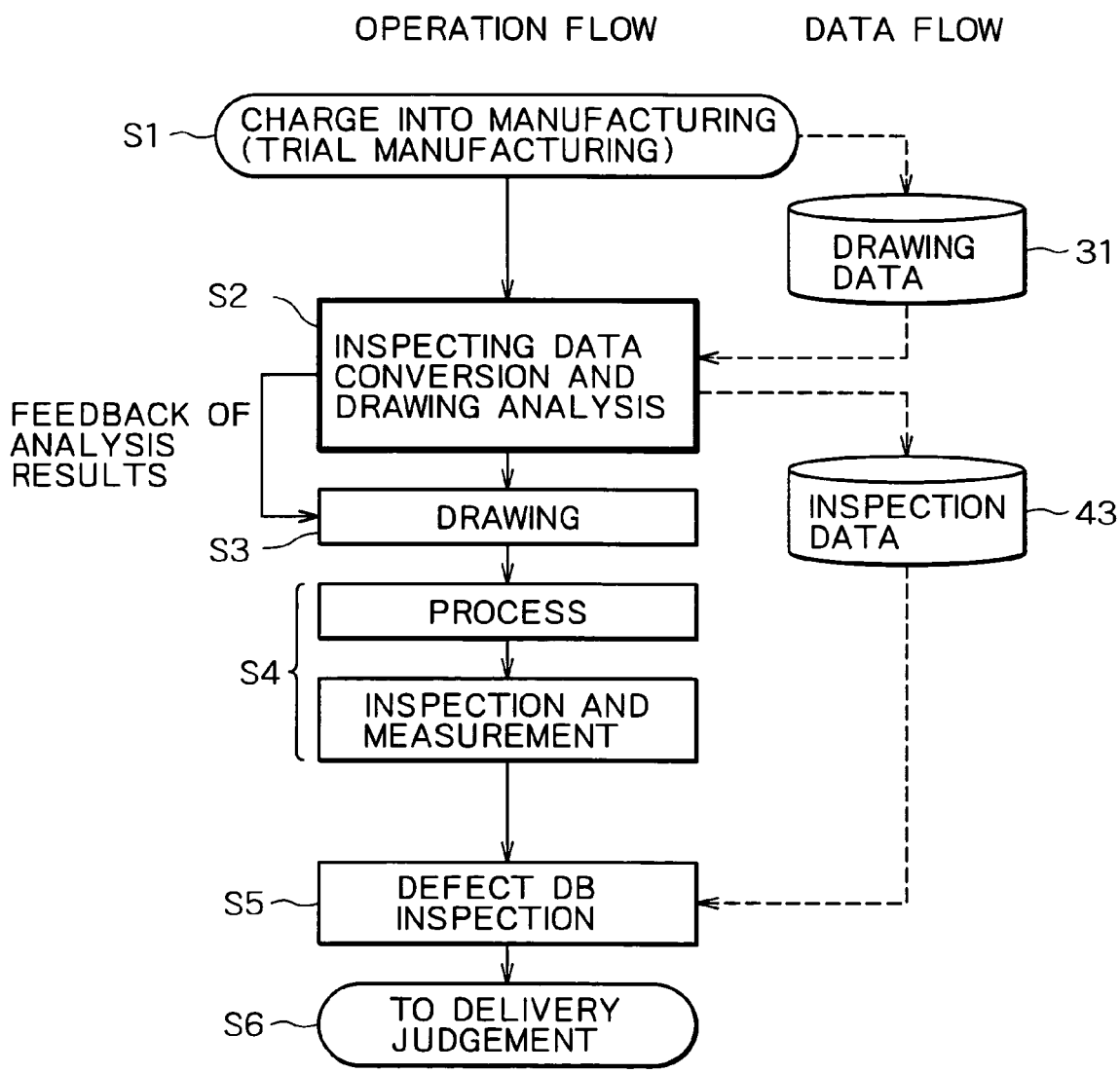
FIG. 3 is a flowchart showing an outline of photomask manufacturing process in the first embodiment of the present invention.

Next, operations of the photomask manufacturing support system according to the present embodiment constructed as mentioned above will be described. FIG. 3 is a flowchart showing an outline of photomask manufacturing process in the present embodiment. First, as shown in step S1 of FIG. 3, manufacturing data 31 is charged into manufacturing (trial manufacturing). In the memory device 3, drawing data 31 has been stored in advance by some means. The drawing data 31 is data which has a hierarchical structure consisting of a plurality of layer's information. The drawing data 31 is composed of graphic information for carrying out drawing, however, the formats thereof are different depending on the types of drawing apparatuses.

Next, as shown in step S2, an inspecting data conversion and a drawing data analysis are carried out based on the drawing data 31. In step S2, the drawing data inputting/interpreting section 21 reads in the drawing data 31 from the memory device 3 and interprets the drawing data 31 appropriately for the different formats. In addition, normally, since the drawing data 31 has a hierarchical structure, without a change, an observed photomask image is hardly obtained. Therefore, the drawing data inputting/interpreting section 21 reads in drawing data 31, extracts data as graphic information closer to an observed photomask image for each mask pattern, and stores the same as interpreted drawing data information 41 in the memory device 4. The format of the interpreted drawing data information 41 is a common format independent of the types of drawing apparatuses.

Next, the data analysis section 22 reads in the interpreted drawing data information 41, and after an analysis/statistical processing of information necessary for feedback to the drawing step, such as white-to-black ratios, numbers of rectangles, and minimum line widths of patterns, stores the same as drawing analysis results 42 in the memory device 4. In addition, the data conversion section 23 reads in the interpreted drawing data information 41, and after a format conversion to data for a DB inspection in an inspection apparatus, stores converted inspection data 43 in the memory device 4.

The interpreted drawing data information 41 has a construction close to that of an observed photomask image, and this allows to extract information in a manner dividing a mask pattern region into a plurality of pieces in fixed units and accumulate the same in the memory device 4. Accordingly, the data analysis section 22 and data conversion section 23 can start processing before the drawing data inputting/interpreting section 21 finishes processing. Namely, if the drawing data inputting/interpreting section 21 proceeds with processing from one side of a photomask in sequence, it becomes possible for the data analysis section 22 and data conversion section 23 to execute processing from the same side in a following manner. In addition, although the data analysis section 22 and data conversion section 23 read in the same interpreted drawing data information 41, since these are independent in terms of their internal processings and are also different in outputting data, it is possible to carry out processing in parallel. Thereby, it becomes possible for the drawing data inputting/interpreting section 21, data analysis section 22, and data conversion section 23 to proceed with processing in parallel with one another.

Next, as shown in step S3, drawing analysis results 42 obtained in step S2 are feed back to a drawing step, which is a following step, then photomask drawing is carried out. Then, as shown in step S4, post-steps such as processings and an inspection and measurement of the drawn photomask are carried out. Thereafter, as shown in step S5, an inspection apparatus (not shown) carries out a DB inspection as to whether there is a defect in the photomask by use of converted inspection data 43. Next, as shown in step S6, a delivery judgement is carried out based on inspection results.

As such, according to the present embodiment, by integrating a drawing data analysis with an inspecting data conversion, the number of man-hours of operation can be reduced.

In addition, since the inspecting data is in a format without a hierarchical structure with a finished photomask image, this can be utilized for forecasting a photomask resolution process.

Namely, conventionally, the formats of drawing data used for a drawing data analysis have been different depending on drawing apparatuses since these have been dependent on the types of drawing apparatuses. In addition, since this format is a format appropriate for drawing, the format has been different from that of an observed photomask image. On the other hand, inspecting data has a format closer to that of an observed photomask image and independent from the types of drawing apparatuses. Therefore, when a photomask analysis is intended, carrying out a conversion by utilizing information interpreted for the purpose of outputting inspecting data is more efficient than converting drawing data as it is.

In such a manner, according to the present embodiment, efficiency of a drawing data analysis can be improved. As such, inspecting data has characteristics as being in a flat format with a finished photomask image, and process support can be carried out by utilizing inspecting data for forecasting a photomask resolution process.

Furthermore, it becomes possible to find a characteristic spot having a minimum pattern interval or a maximum pattern density and indicate the same to an operator.

Still furthermore, characteristic coordinate values which are necessary in process management can be outputted, by an operator's instruction, to various inspection devices regarding quality assurance of a photomask such as a process observation by a microscope or the like, a line width measurement, a long dimension measurement, a perpendicularity measurement, and an overlay accuracy measurement. Thereby, a search for characteristic coordinates can be semi-automated, thus efficiency of a process analysis can be improved. In addition, since accurate characteristic coordinates can be observed, yield is improved.

The memory device 3 may be inside the data processing device 2 or may be at a remote place accessible via networks. In addition, the memory device 4 may be located at a remote place accessible from the data processing device 2, however, in order to avoid a reduction in processing speed, this is preferably a device locally connected from the data processing device 2. Furthermore, in the present embodiment, although the interpreted drawing data information 41, the drawing analysis results 42, and the DB inspection data 43 for an inspection apparatus are all stored in the memory device 4, these may be respectively stored in separate memory devices.

In addition, as mentioned above, when extracting graphic information according to respective mask patterns from the drawing data 31 which has a hierarchical structure consisting of a plurality of layer's information, the drawing data inputting/interpreting section 21 can extract graphic information in a manner dividing a mask pattern region into a plurality of pieces. And, the data conversion section 23 can convert in sequence the graphic information extracted in a divided manner to the DB inspection data 43 for an inspection apparatus to carry out a defect inspection by a comparison with an inspecting mask pattern. At this time, the data analysis section 22 may use in sequence information generated in the course of conversion to the DB inspection data 43 from the interpreted drawing data information 41, that is, graphic information with a finished drawing image of a photomask without a hierarchical structure, for an analysis of drawing analysis results used in a mask pattern drawing process.

Figure 4:
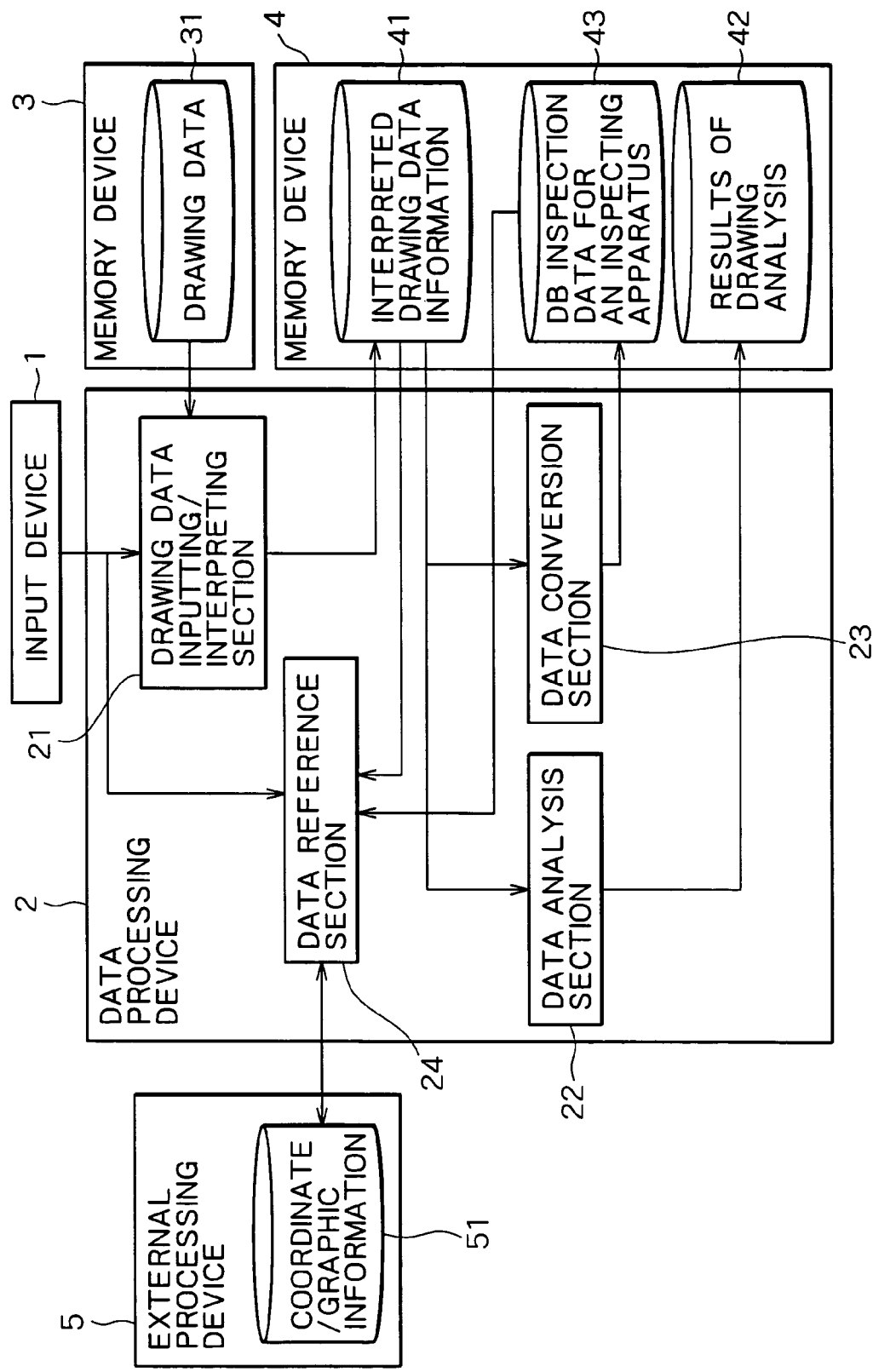
FIG. 4 is a block diagram showing a photomask manufacturing support system according to a second embodiment of the present invention.

Next, a second embodiment of the present invention will be described. FIG. 4 is a block diagram showing a photomask manufacturing support system according to the present embodiment. Although FIG. 4 is a block diagram almost following FIG. 2, this is different in that a data reference section 24 is provided in the data processing device 2, and an external information processing device 5 is provided.

The data reference section 24 is a tool such as a viewer for displaying a photomask image with reference to the interpreted drawing data information 41 and the DB inspection data 43, for example, and this reads out the interpreted drawing data information 41 and the DB inspection data 43 stored in the memory device 4 and outputs coordinate/graphic information 51 to the external information processing device 5. The external information processing device 5 is an external-appearance observation device such as a microscope, a line width measuring device or the like. Other aspects of the construction in the present embodiment are the same as those of the above-mentioned first embodiment.

Next, operations of the photomask manufacturing support system according to the present embodiment constructed as described above will be described. First, the drawing data inputting/interpreting section 21 reads in drawing data 31 from the memory device 3, extracts graphic information, and stores the same as interpreted drawing data information 41.

Next, the data analysis section 22 reads in the interpreted drawing data information 41, analyzes information necessary for a drawing step, and stores the same as drawing analysis results 42 in the storing device 4. In addition, the data conversion section 23 reads in the interpreted drawing data information 41, and after a format conversion to data for a DB inspection in an inspection apparatus, stores converted inspection data 43 in the memory device 4. In the present embodiment, although the interpreted drawing data information 41, the drawing analysis results 42, and the DB inspection data 43 for an inspecting apparatus are all stored in the memory device 4, these may be respectively stored in separate memory devices. In addition, parameters and the like necessary for processing these can be given in advance via an input device 1 by an operator or can be obtained by communications with the external processing device 5.

According to the present embodiment, by outputting graphic information (coordinate/graphic information 51) and the like at a specific coordinate obtained by utilizing the data reference section 24 to the external processing device 5, data can be feed back to a process analysis after photomask drawing.

What is claimed is:

1. A photomask manufacturing support system comprising:
   a data processing device comprising:
   a drawing data interpreting unit for extracting graphic information for respective mask patterns from drawing data which has a hierarchical structure consisting of a plurality of layer's information;
   a data analysis unit for analyzing said graphic information to output analysis results thereof to be used in a mask pattern drawing process; and
   a data conversion unit for converting said graphic information to inspection data for carrying out a defect inspection in comparison with a mask pattern to be inspected,
   wherein said data conversion unit and said data analysis unit execute in parallel on said graphic information prior to the completion of said drawing data interpreting unit extracting all said graphic information,
   wherein said drawing data interpreting unit extracts said graphic information in a manner dividing a mask pattern region into a plurality of pieces, said data conversion unit converts in sequence said graphic information extracted in a divided manner to inspection data for carrying out a defect inspection in comparison with a mask pattern to be inspected, and said data analysis unit uses in sequence, said graphic information having a finished drawing image of a photomask without a hierarchical structure generated in the course of conversion to said inspection data, for an analysis of drawing analysis results to be used in a mask pattern drawing process.

2. The photomask manufacturing support system according to claim 1, further comprising a data reference unit for preparing coordinate and graphic information based on said graphic information and said inspection data, and outputting said coordinate or graphic information to an external device.

* * * * *

UNITED STATES PATENT AND TRADEMARK OFFICE
CERTIFICATE OF CORRECTION

PATENT NO. : 7,664,307 B2
APPLICATION NO. : 11/092708
DATED : February 16, 2010
INVENTOR(S) : Yasuko Saito It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 944 days.

Signed and Sealed this

Twenty-eighth Day of December, 2010

David J. Kappos
*Director of the United States Patent and Trademark Office*